(12) United States Patent
Gupta et al.

(10) Patent No.: US 7,564,141 B2
(45) Date of Patent: Jul. 21, 2009

(54) APPARATUS AND METHOD FOR PREVENTING CONFIGURABLE SYSTEM-ON-A-CHIP INTEGRATED CIRCUITS FROM BECOMING I/O LIMITED

(75) Inventors: Vikram Gupta, Fremont, CA (US); Ed Lambert, Pleasanton, CA (US)

(73) Assignee: Broadcom Corporation, Irvine, CA (US)

( * ) Notice: Subject to any disclaimer, the term of this patent is extended or adjusted under 35 U.S.C. 154(b) by 203 days.

(21) Appl. No.: 11/509,714

(22) Filed: Aug. 25, 2006

(65) Prior Publication Data

US 2007/0220191 A1    Sep. 20, 2007

Related U.S. Application Data

(60) Provisional application No. 60/783,072, filed on Mar. 17, 2006.

(51) Int. Cl.
  *H01L 23/48* (2006.01)
  *H01L 23/52* (2006.01)
  *H01L 29/40* (2006.01)
(52) U.S. Cl. .................. 257/786; 257/784; 257/724
(58) Field of Classification Search .......... 257/723, 257/724, 777, 784, 786
See application file for complete search history.

(56) References Cited

U.S. PATENT DOCUMENTS

| 5,948,114 A * | 9/1999 | Klingler ............... 714/733 |
| 7,266,624 B1 * | 9/2007 | Gaither et al. ......... 710/71 |
| 7,409,005 B2 * | 8/2008 | Chang ................ 375/295 |
| 2006/0129728 A1 * | 6/2006 | Hampel .............. 710/118 |

* cited by examiner

*Primary Examiner*—S. V Clark
(74) *Attorney, Agent, or Firm*—Sterne, Kessler, Goldstein & Fox P.L.L.C.

(57) ABSTRACT

An integrated circuit containing multiple modules coupled to a pad via a multiplexer. The modules are selectively coupled to the pad by the multiplexer to provide integrated circuit function flexibility with a limited number of pads. A multiplexer select signal determines which module or clock circuit is coupled by the multiplexer. A common buffer may be coupled between the multiplexer and the pad to save substrate space. An analog circuit may be coupled to the pad to provide a signal path minimizing signal distortion. The integrated circuit's clock may be coupled via the multiplexer to an off-substrate circuit. Selective module coupling improves the integrated circuit's testing speed, may salvage an integrated circuit containing a malfunctioning module, and provides for signal loopback during testing.

15 Claims, 14 Drawing Sheets

US 7,564,141 B2

APPARATUS AND METHOD FOR PREVENTING CONFIGURABLE SYSTEM-ON-A-CHIP INTEGRATED CIRCUITS FROM BECOMING I/O LIMITED

CROSS REFERENCE TO RELATED APPLICATIONS

This application claims the benefit of U.S. Provisional Application No. 60/783,072, filed Mar. 17, 2006, which is incorporated herein by reference in its entirety.

FIELD OF THE INVENTION

The present invention is generally directed to integrated circuits. More particularly, the invention relates to an apparatus and method for preventing configurable integrated circuits from becoming in/out limited.

BACKGROUND OF THE INVENTION

The density of integrated circuits that may be deposited on a substrate is growing much more rapidly than the density of pads used to connect the integrated circuit to circuits outside the integrated circuit's package. Thus, bottlenecks occur in signal transfer to and from an integrated circuit. These bottlenecks occur in highly-configurable system-on-a-chip (SOC) integrated circuits rendering the SOC in/out (I/O) limited. SOC's contain numerous peripheral circuits, many of which are not used in all applications of the SOC. If physical I/O requirements of all SOC peripherals are supported, either the SOC is large in size or is I/O limited.

In addition, market demand is driving a desire for increased integrated circuit versatility. For example, it is desirable to produce an audio processing chip that may connect to other circuits by many different industry standard interfaces without having a multitude of unused pads and unused through-package conductors. It is inefficient to manufacture a chip having these unused conductors.

Also, integrated circuits are currently designed so a circuit board designer is constrained by a chip manufacturer's pinout of the integrated circuit package. It is desirable to increase flexibility of an integrated circuit's pinout so circuit board designers have greater flexibility in board design. Pinout flexibility may be increased by providing a way to use a minimum number of integrated circuit leads with a maximum number of circuits on a substrate.

Another problem with current integrated circuit manufacturing techniques is that integrated circuits with failed sections of circuitry are often discarded. It is desirable to salvage as many of these chips as possible by using them in some productive manner. Salvaging would minimize waste and thus increase fabrication facility efficiency.

Finally, integrated circuit testing often requires looping of signals from an integrated circuit under test back to the integrated circuit under test. Loopback currently takes place externally to a chip and thus requires external circuitry. It is desirable to reduce circuitry external to a chip to reduce testing costs and therefore reduce fabrication facility costs while increasing fabrication facility efficiency.

Accordingly, what is needed is an apparatus and method that overcomes the shortcomings noted above.

BRIEF SUMMARY OF THE INVENTION

An integrated circuit containing multiple modules is coupled to a pad via a multiplexer. The modules are selectively coupled to the pad by a multiplexer to provide integrated circuit function flexibility with a limited number of pads. A multiplexer select signal determines which module or clock circuit is coupled by the pad. A common buffer between the multiplexer and the pad saves substrate space. An analog circuit on a substrate may be coupled to the pad to provide a signal path minimizing signal distortion by digital noise feedback. The integrated circuit's clock may be coupled via the multiplexer to an off-substrate circuit. Selective module coupling improves integrated circuit testing speed, may salvage an integrated circuit containing a malfunctioning module, and provides for signal loopback during testing.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1A:
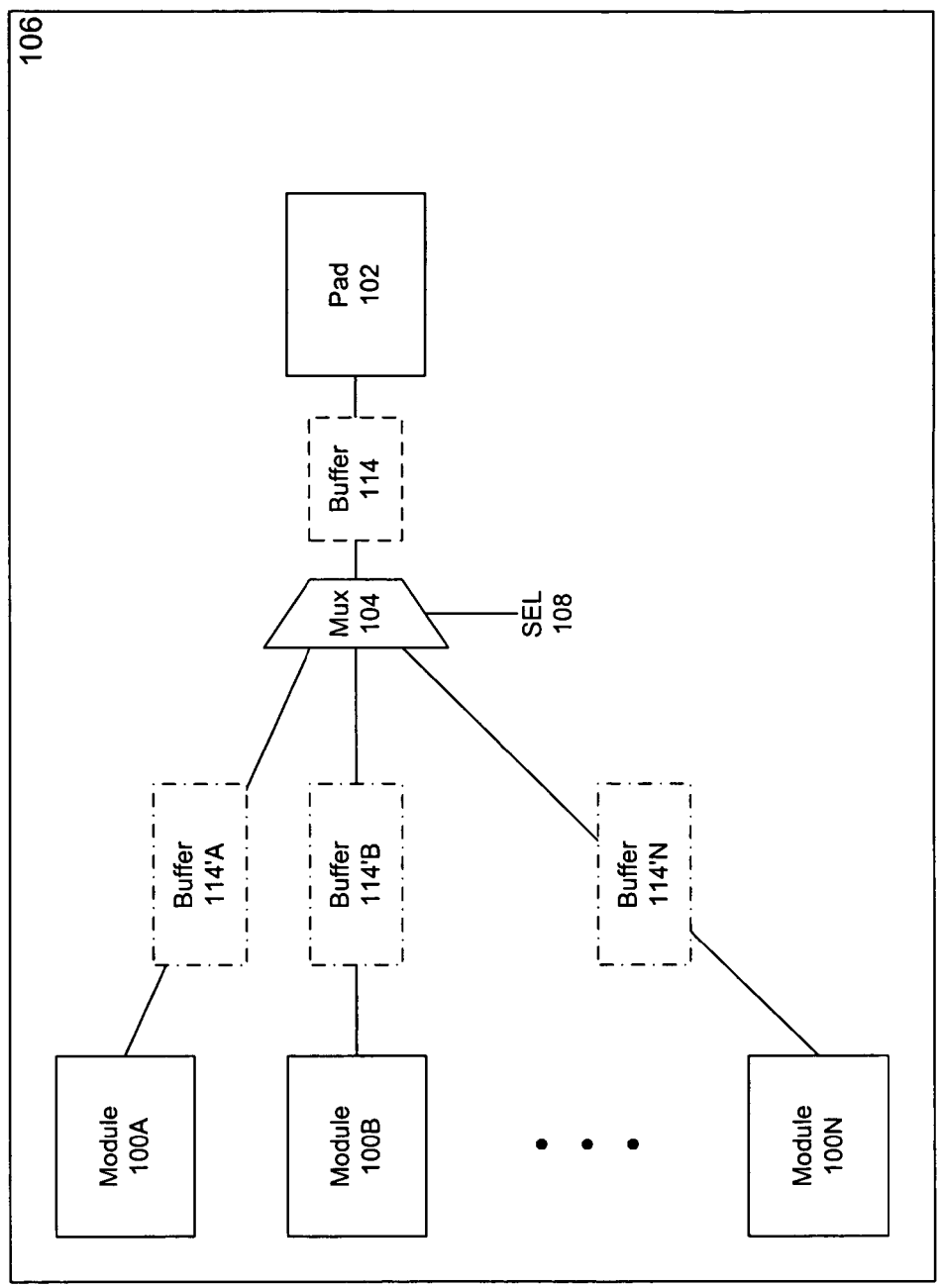
FIG. 1A illustrates a block diagram in which multiple modules are coupled to a pad via a multiplexer and a buffer.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

As introduced above, various embodiments involve an apparatus and/or method for preventing configurable systemon-a-chip integrated circuits from becoming I/O limited. FIGS. 1-11, described below, illustrate this approach.

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Structure

FIG. 1A illustrates an exemplary block diagram of an embodiment in which multiple integrated circuit modules 100A,B, . . . ,N are coupled to a pad 102 via a multiplexer 104. The number of modules 100 is variable, but must number at least two. The modules 100, the multiplexer 104 and the pad 102 are deposited on a substrate 106.

The modules 100 are integrated circuits. The modules 100 include, and are not limited to, any circuit deposited on the substrate 106 where that circuit's function is dependent upon transfer of energy via the pad 102. The modules 100 need not be identical in function or design. Multiple types of modules 100 may be coupled to the multiplexer 104. Modules 100 may carry analog signals, digital signals, and power for the integrated circuit. For example, the modules 100 may be, but are not limited to, any of the following circuit types: analog, digital, interface, System Packet Interface (SPI), Inter-Integrated Circuit Sound Bus (I$^2$S), Universal Asynchronous Receiver Transmitter (UART), Inter-Integrated Circuit Bus (I$^2$C), Universal Serial Bus (USB), Parallel In/Out (PIO), and/or audio interface. The modules 100 may have at least one conductor coupled to the multiplexer 104.

The multiplexer 104 is integrated on the substrate 106 and is used to couple the modules 100 to the pad 102. In the case illustrated in FIG. 1A in which the modules 100 are coupled to the pad 102 via the multiplexer 104, a signal on a select line (SEL) 108 determines which modules 100 are coupled to the pad 102.

The pad 102 is deposited on the substrate 106 and provides a conductor so the integrated circuit may be coupled to a circuit that is not integrated on the substrate 106. For example, the pad 102 may be a bond pad used for wirebonding and/or ballbonding. The pads 102 take up valuable space on the substrate 106. Thus it is desirable to minimize the number of the pads 102. In one embodiment, the substrate 106 may have up to twenty-eight pads 102.

FIG. 1A also shows that the modules 100 may be coupled to the pad 102 via the multiplexer 104 and a common buffer 114. Use of the common buffer 114 is optional. The common buffer 114 saves space on the substrate 106 because it removes the need for multiple buffers coupled between each of the modules 100 and the multiplexer 104. The select line 108 determines which of the modules 100 the multiplexer 104 couples to the buffer 114 and the pad 102.

In another exemplary circuit where space on the substrate 106 is not as much at a premium, a separate buffer 114'A, B, . . . , N may be coupled between each of the respective modules 100A,B, . . . , N and the multiplexer 104. Signal flow through the buffer 114 or buffers 114' may be unidirectional, bidirectional, or both.

Figure 1B:
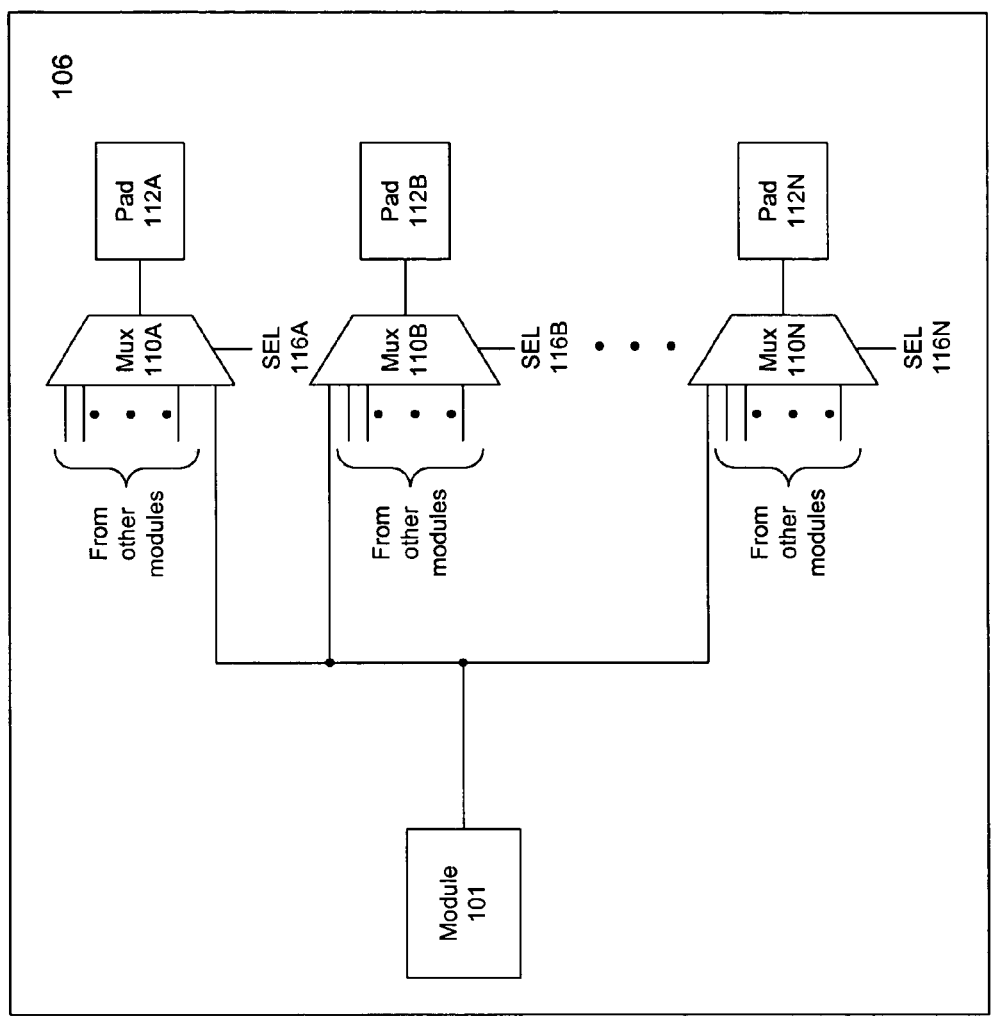
FIG. 1B illustrates a block diagram in which a module is coupled to multiple pads via multiple multiplexers.

FIG. 1B illustrates an exemplary block diagram of another embodiment in which an integrated circuit module 101 is coupled to multiple pads 112A,B, . . . , N via multiple multiplexers 110A,B, . . . , N. The number of the pads 112 is variable, but must number at least two. In this example, the number of multiplexers 110 is also variable, but must number at least two. A select line 116A,B, . . . , N instructs the multiplexer 110 which of the pads 112 is to be coupled to the module 101 via the multiplexer 110. The module 101, the multiplexers 110, and the pads 112 are deposited on the substrate 106.

Figure 2:
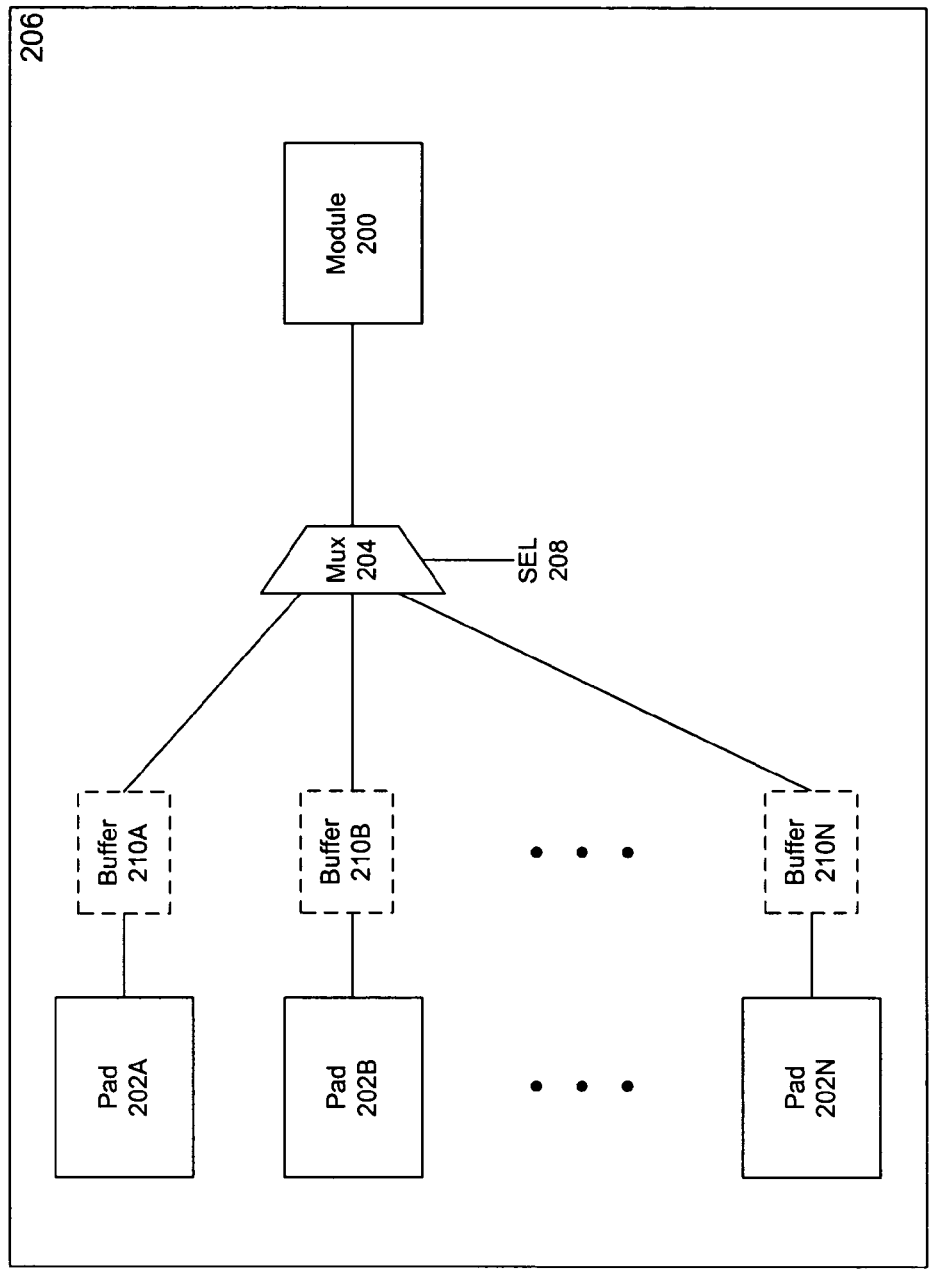
FIG. 2 illustrates a block diagram showing multiple pads coupled to a module via a multiplexer and multiple buffers.

FIG. 2 illustrates an exemplary block diagram of a further embodiment in which multiple pads 202A,B, . . . , N are coupled to a module 200 via a multiplexer 204. In this example, the number of pads 202 is variable, but must number at least two. The pads 202, the multiplexer 204, and the module 200 are deposited on a substrate 206. In the case illustrated in FIG. 2, a signal on a select line (SEL) 208 determines which of the pads 202 is coupled to the module 200.

FIG. 2 also shows that the multiple pads 202 may be coupled to the module 200 via the multiplexer 204 and via dedicated buffers 210A,B, . . . , N. The buffers 210 are optional. The buffers 210 may be unidirectional, bidirectional, or both.

Figure 3:
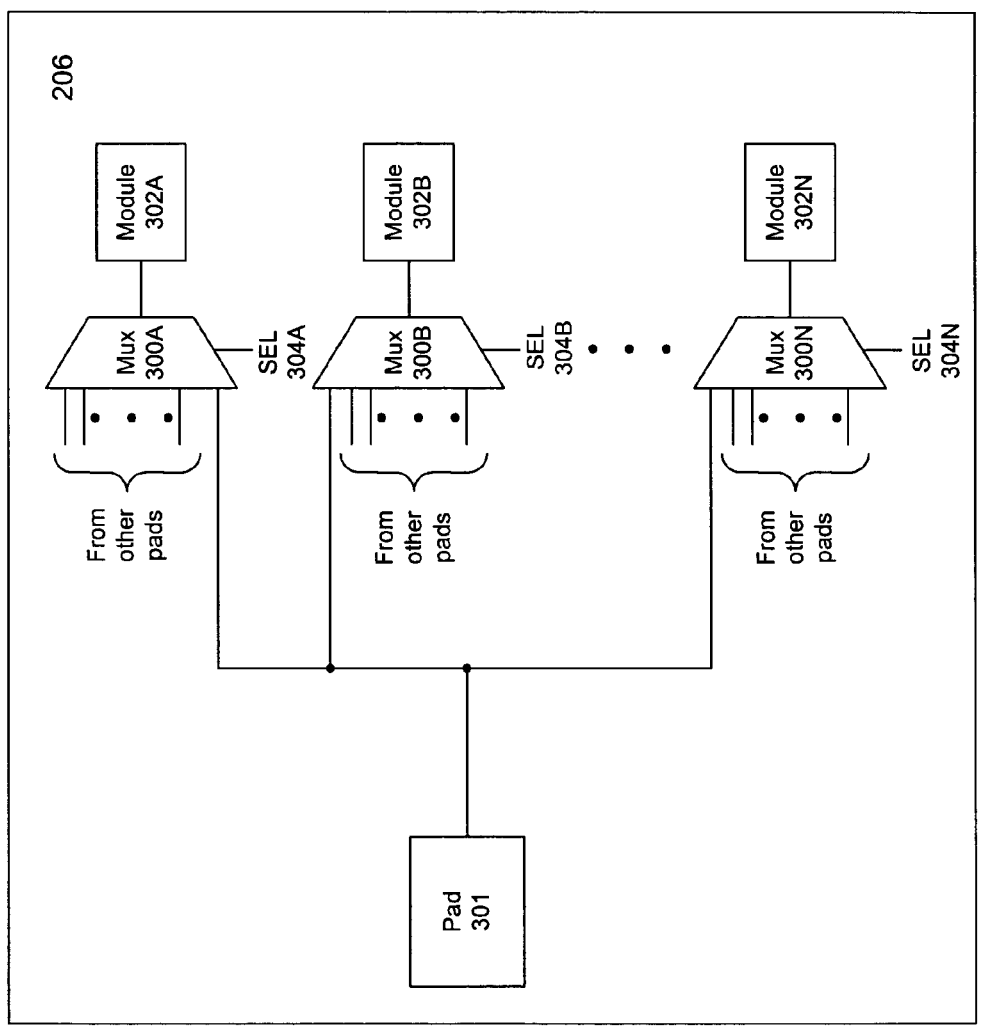
FIG. 3 illustrates a block diagram in which a pad is coupled to multiple modules via multiple multiplexers.

FIG. 3 illustrates another exemplary block diagram of a further embodiment in which a pad 301 is coupled to multiple modules 302A,B, . . . , N via multiple multiplexers 300A, B, . . . , N. In this example, the number of the modules 302 is variable, but must number at least two. In the case illustrated in FIG. 3, a signal on the select line (SEL) 304A,B, . . . , N determines which of the modules 302 is coupled to the pad 301. The pad 301, the multiplexers 300 and the modules 302 are deposited on the substrate 206.

Figure 4:
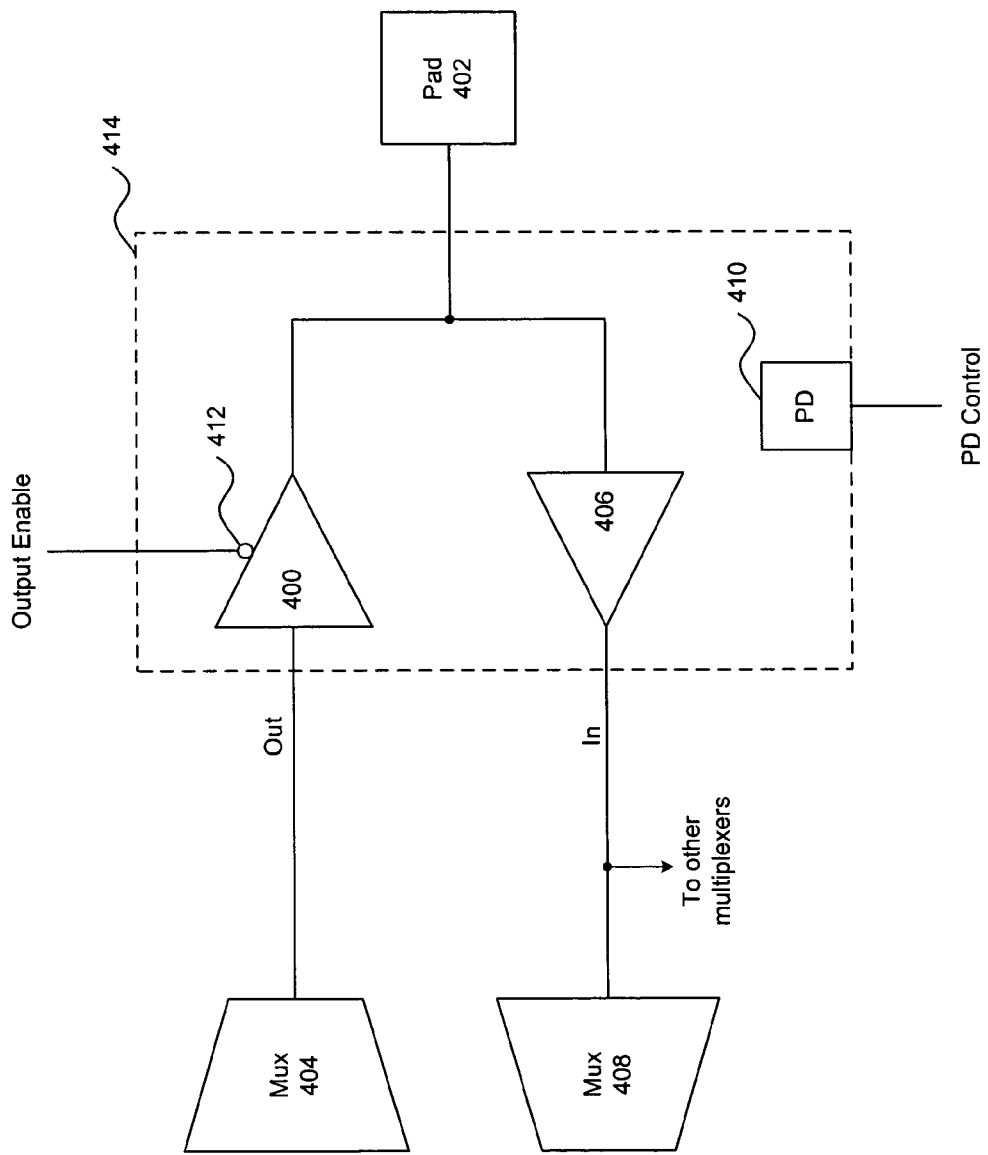
FIG. 4 illustrates a block diagram of a buffer circuit.

An example of a buffer 414 corresponding to buffers 114, 114', and 210 is shown in FIG. 4. In this example, the buffer 414 comprises an amplifier 400 that couples a multiplexer 404 to a pad 402. The buffer 414 also contains an amplifier 406 that couples a multiplexer 408 to the pad 402. In other examples, the amplifier 406 is coupled to more than one multiplexer. In an example, the buffer 414 may contain an output enable 412 to control enablement of the amplifier 400 and/or the amplifier 406. The buffer 414 may also contain a power down (PD) 410 to control power application to the buffer 414. The output enable circuit 412 as shown in FIG. 4 has an inverting input. In another embodiment, the output enable circuit 412 has a non-inverting input.

Figure 5:
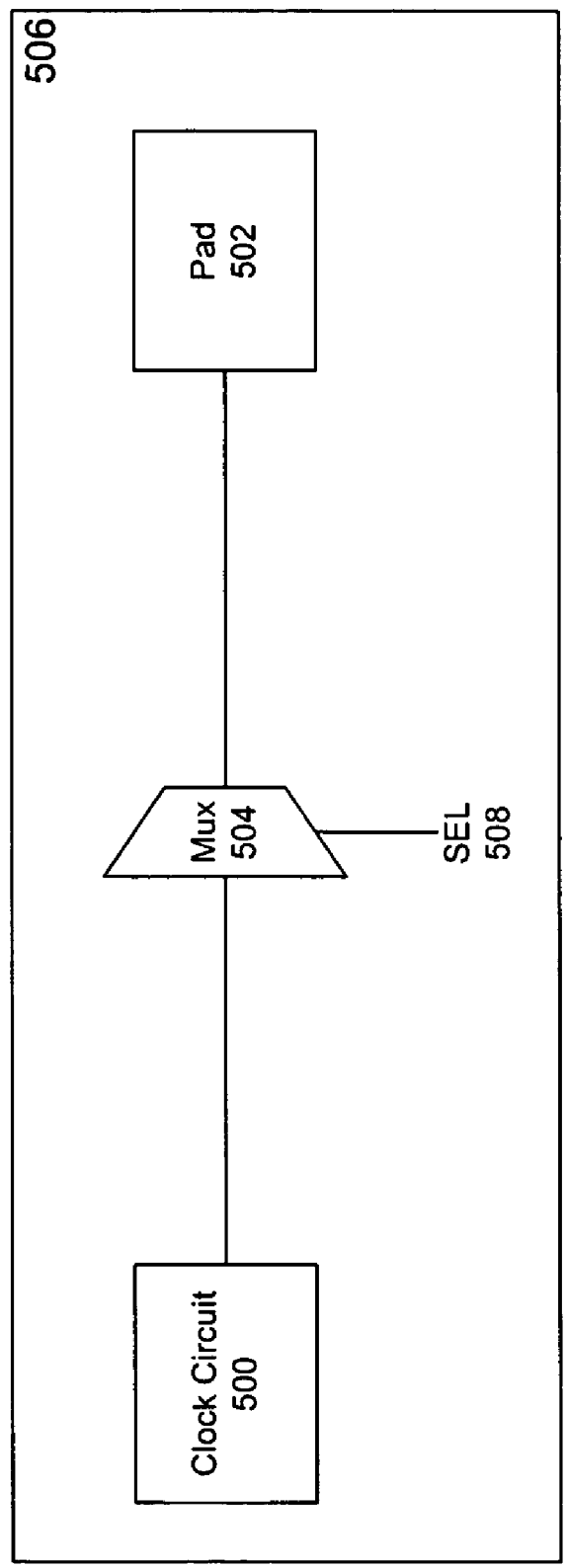
FIG. 5 illustrates a block diagram in which a clock circuit is coupled to a pad via a multiplexer.

FIG. 5 shows a block diagram of an example in which a clock circuit 500 deposited on a substrate 506 is coupled to a pad 502 via a multiplexer 504. A select line (SEL) 508 determines if the clock circuit 500 is coupled to the pad 502. This provides a means for the clock circuit 500 on the substrate 506 to be coupled to a circuit external to an integrated circuit containing the clock circuit 500. This exemplary circuit may be used to provide synchronization of the integrated circuit with a circuit that is both external to the integrated circuit and coupled to the integrated circuit. This exemplary circuit also provides a means to couple the clock circuit 500 to a module on the substrate 506 via the pad 502.

Figure 6:
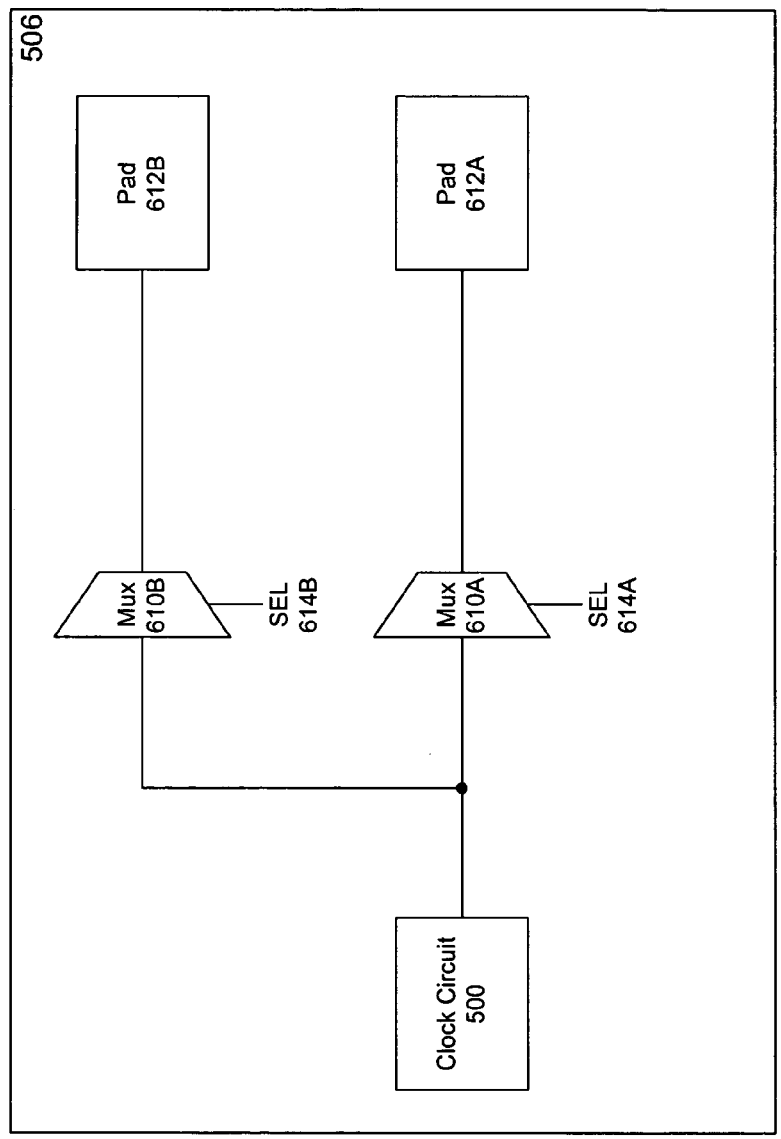
FIG. 6 illustrates a block diagram in which a clock circuit is coupled to multiple pads via multiple multiplexers.

In another example illustrated in FIG. 6, the clock circuit 500 on the substrate 506 is coupled to multiple pads 612A,B via multiple multiplexers 610A,B. A select line (SEL) 614A,B determines which pad 612 is coupled to the clock circuit 500. This provides a means for coupling the clock circuit 500 to the multiple pads 612.

Figure 7A:
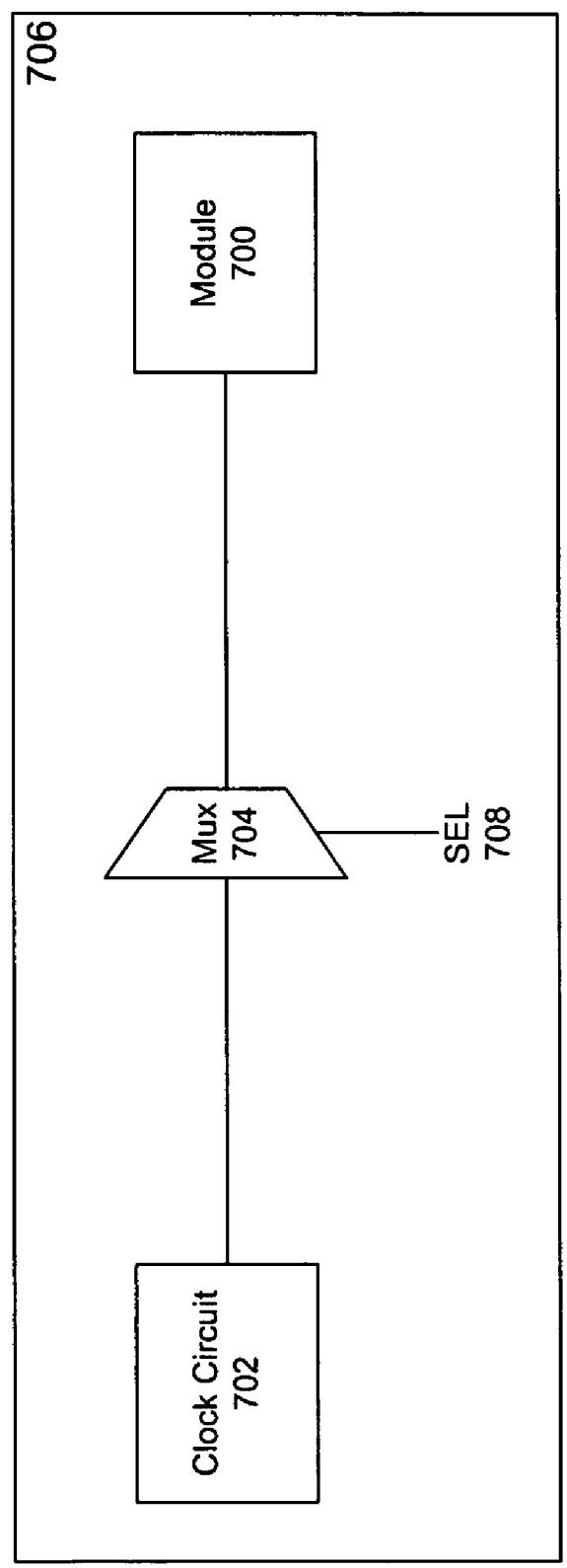
FIG. 7A illustrates a block diagram in which a clock circuit is coupled to a module via a multiplexer.

FIG. 7A shows a block diagram of an example in which a clock circuit 702 deposited on a substrate 706 is coupled to a module 700 via a multiplexer 704. In this example, the clock circuit 702 is not coupled to the module 700 via a pad. In other exemplary circuits, the clock circuit 702 is coupled to the module 700 via a pad. The exemplary circuit of FIG. 7A may be used to provide internal synchronization of the module 700 within the integrated circuit. A select line (SEL) 708 determines if the clock circuit 702 is coupled to the module 700.

In an example that may be used with any of the figures described herein, an off-substrate clock circuit is coupled to and/or from a module via a pad, a buffer, and/or a multiplexer. An off-substrate clock circuit may be coupled to an on-substrate module such as, and not limited to, a logic circuit and/or clock circuit.

Figure 7B:
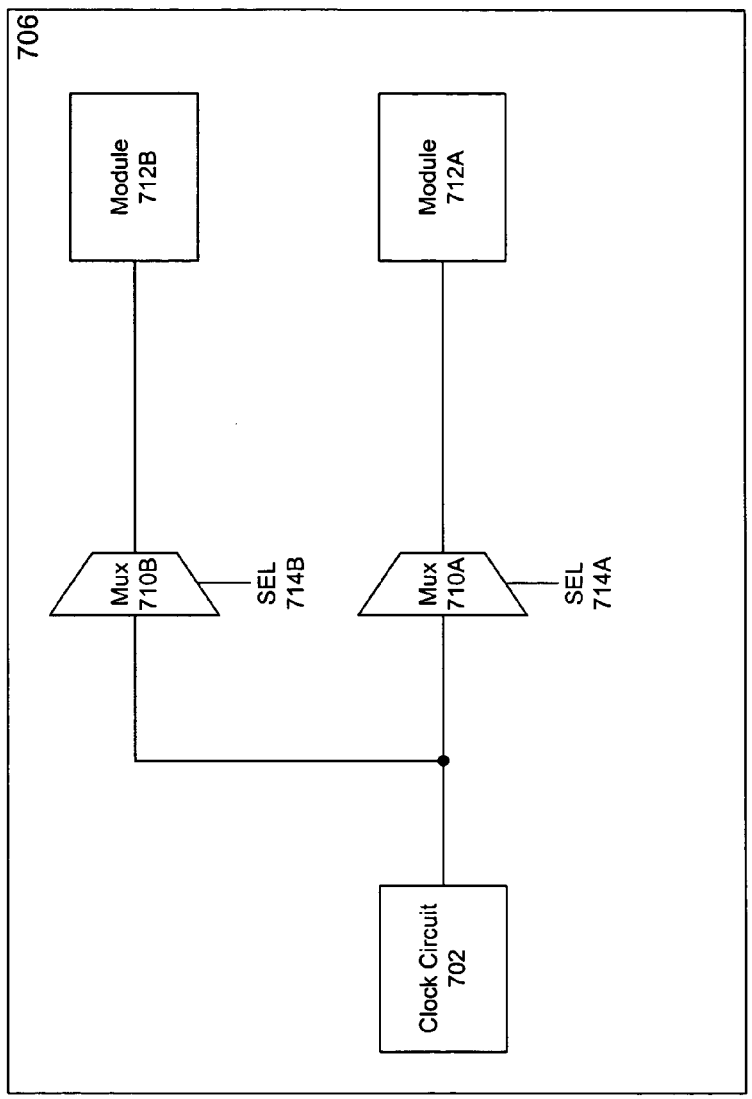
FIG. 7B illustrates a block diagram in which a clock circuit is coupled to multiple modules via multiple multiplexers.

In another example illustrated in FIG. 7B, the clock circuit 702 is coupled to multiple modules 712A,B via multiple multiplexers 710A,B. A select line (SEL) 714A,B determines which module 712 is coupled to the clock circuit 702. This provides a means for coupling the clock circuit 702 to the multiple modules 712.

Figure 8:
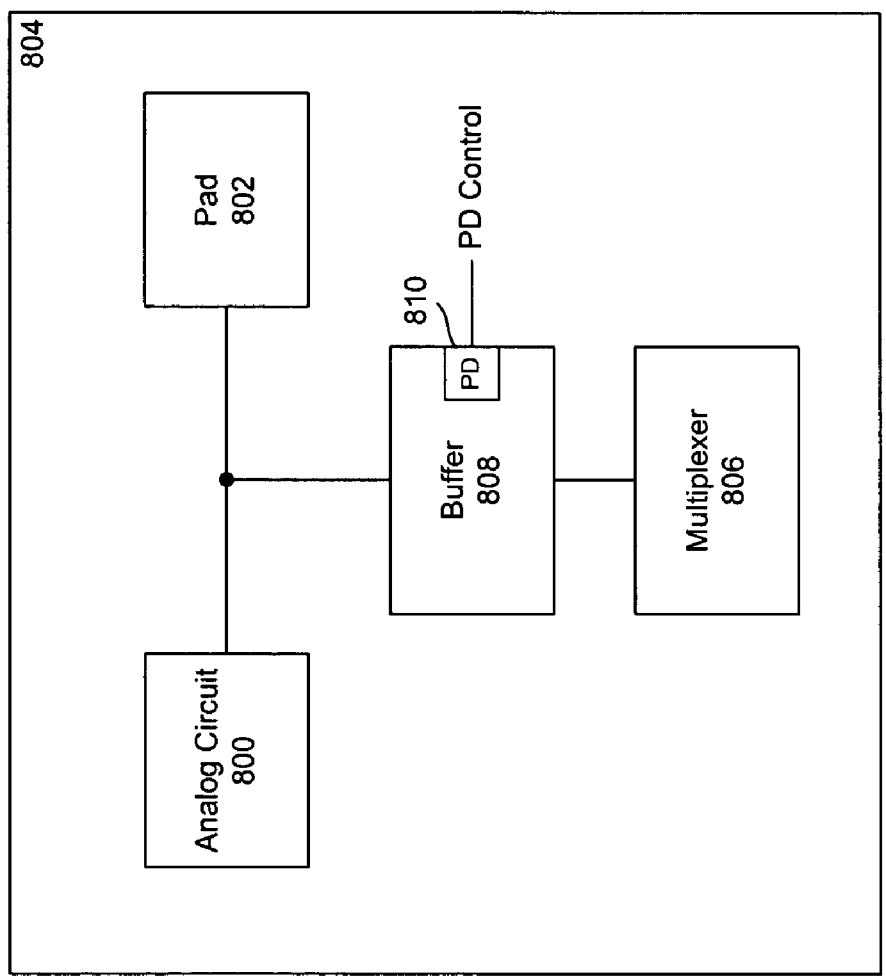
FIG. 8 illustrates an analog circuit coupled to a pad.

FIG. 8 illustrates a block diagram of an exemplary circuit in which an analog circuit 800 on a substrate 804 is coupled to a pad 802 without being coupled via a multiplexer 806. The multiplexer 806 is coupled to the pad 802 via a buffer 808. The buffer 808 includes a power down control (PD) 810.

Figure 9:
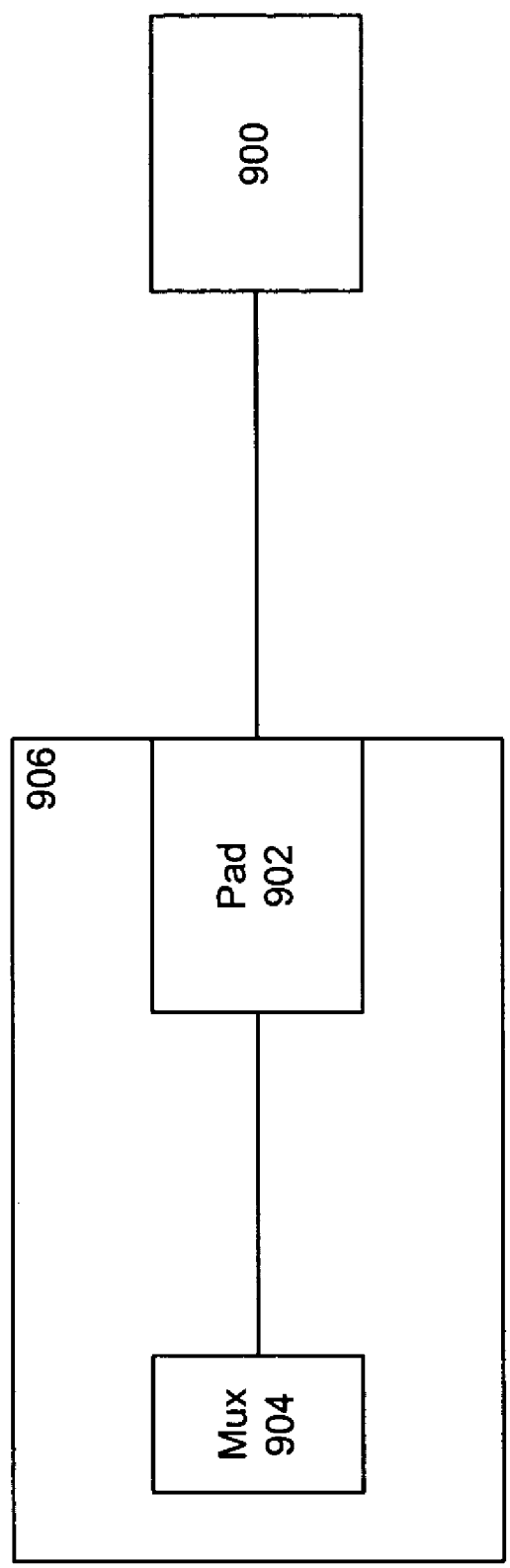
FIG. 9 illustrates a pad and a multiplexer that are coupled to a second circuit.

FIG. 9 illustrates a block diagram of an example in which a pad 902 on a substrate 906 and a multiplexer 904 are coupled to a circuit 900. The circuit 900 may be on the substrate 906 or may be on a different substrate. The circuit 900 may also be a circuit external to the integrated circuit package.

Figure 10A:
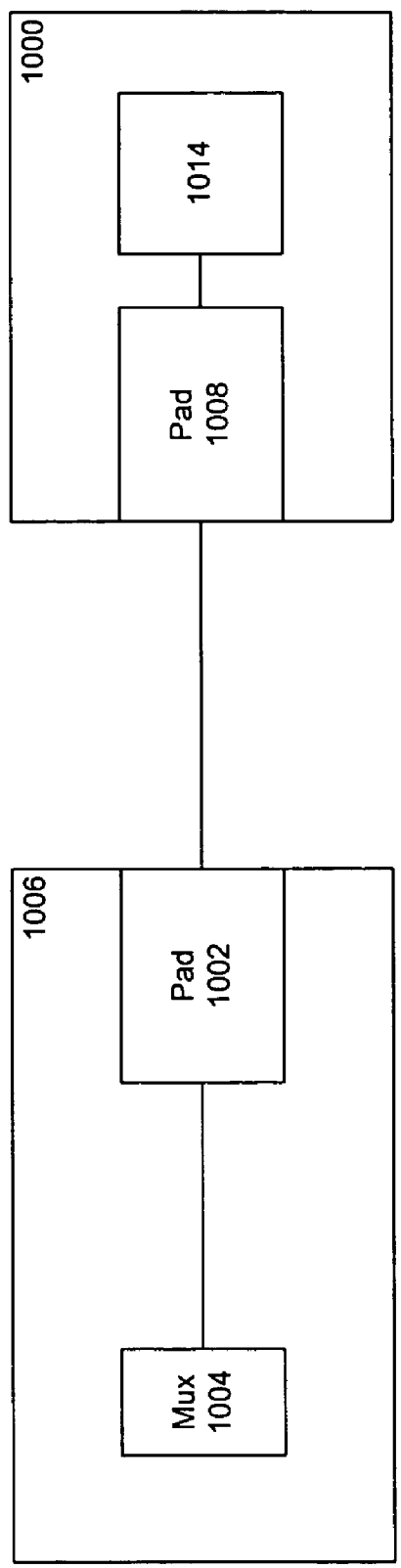
FIG. 10A illustrates a pad and a multiplexer on a substrate that are coupled to a second pad on a second substrate.

FIG. 10A illustrates a block diagram of an example in which a pad 1002 and a multiplexer 1004 on a substrate 1006 are coupled to a pad 1008 on a substrate 1000. This provides for coupling of signals passed through the multiplexer 1004 so the signals may be processed by a circuit 1014.

Figure 10B:
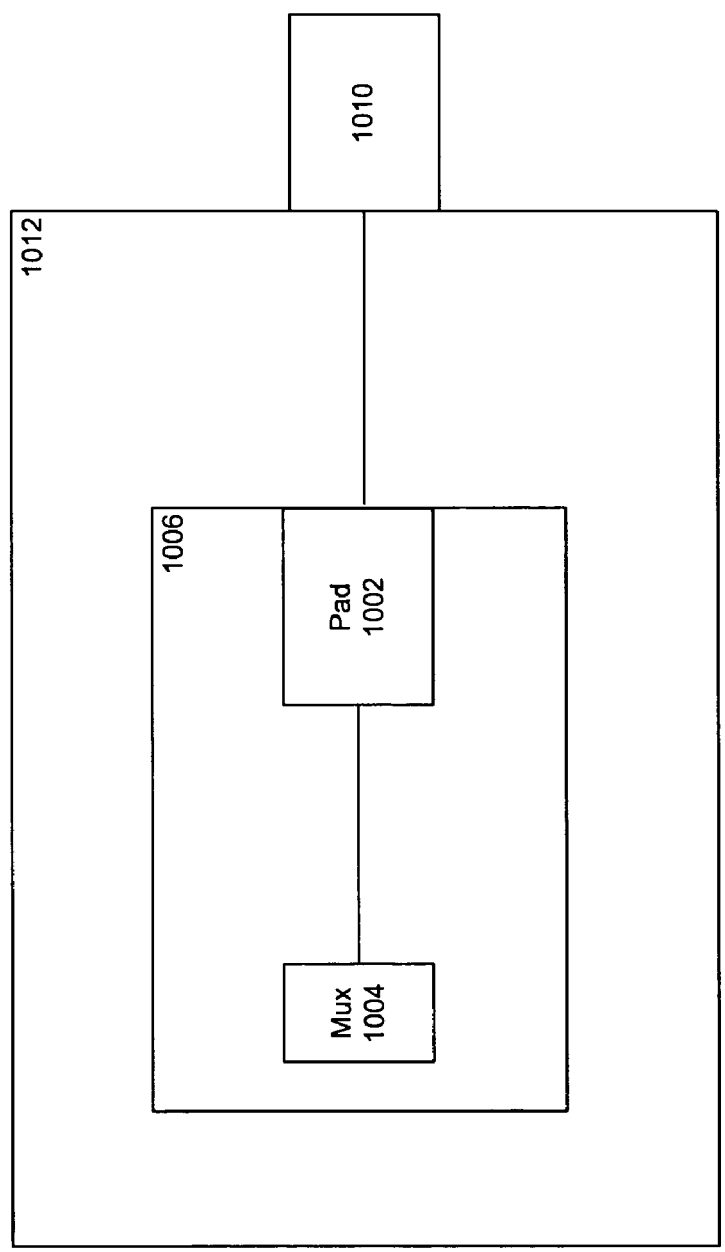
FIG. 10B illustrates an exemplary circuit having a pad and a multiplexer on a substrate where the pad is coupled to a conductive interface external to a package of an integrated circuit.

FIG. 10B illustrates a block diagram of an exemplary circuit having the pad 1002 and the multiplexer 1004 on the substrate 1006 where the pad 1002 is coupled to a conductive interface 1010 external to a package 1012 of an integrated circuit. The conductive interface 1010 couples circuits on the substrate 1006 to a circuit external to the integrated circuit package 1012. For example, the conductive interface 1010 may be a lead, pin, or ball. In other examples, the conductive interface 1010 may be a wire, part of an array of conductive elements, a connector, or a physical interface.

Figure 11:
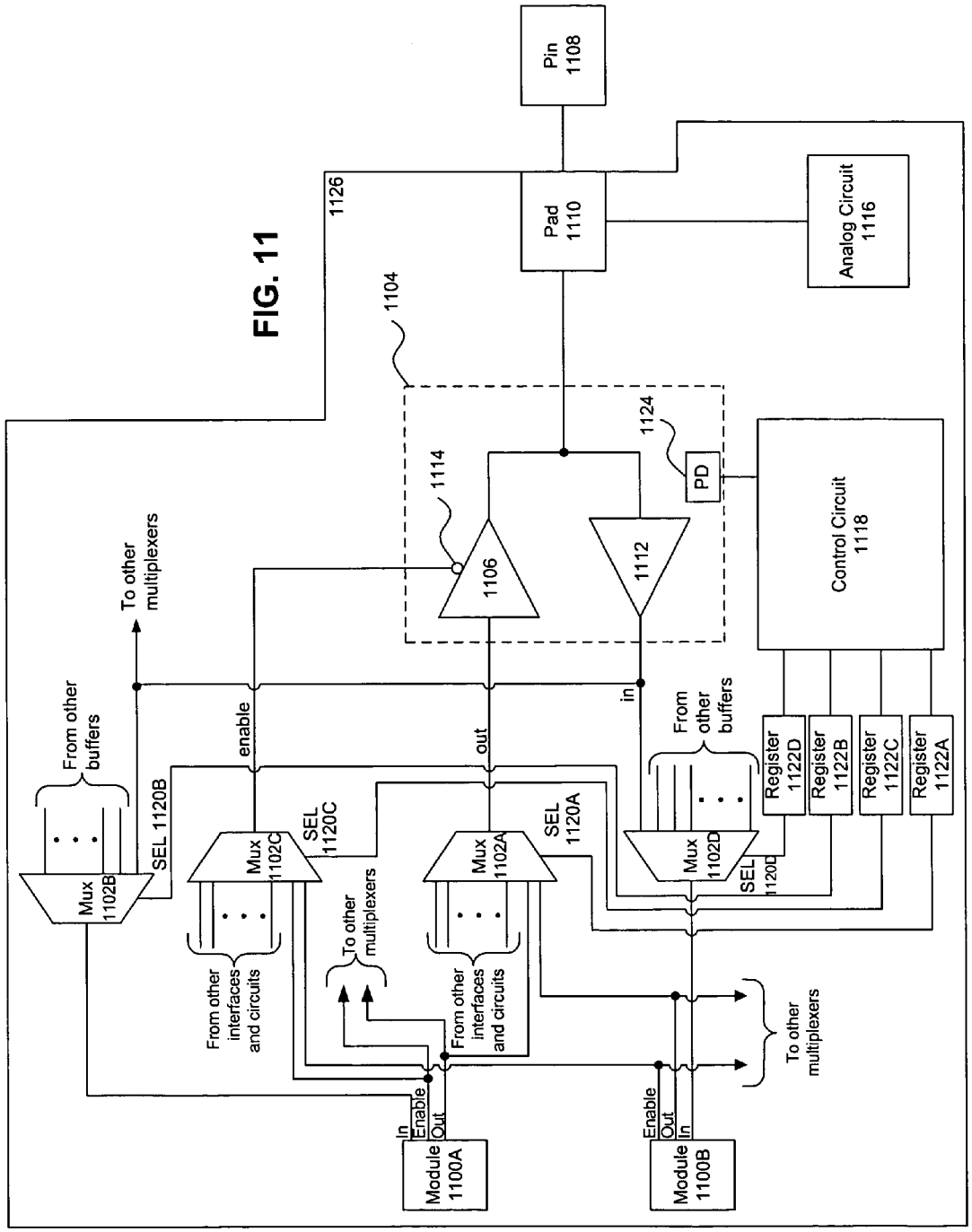
FIG. 11 illustrates a block diagram of an example embodiment in which two modules are selectively coupled to a pad.

FIG. 11 illustrates a block diagram of an example in which two modules 1100A,B are selectively coupled to a pad via multiplexers 1102A-D and a buffer 1104. The output of the module 1100A is coupled to an input of the multiplexer 1102A along with other signals from other modules including the module 1100B. The output of the module 1100A and the module 1100B may also be coupled to the input of other multiplexers. The output of the multiplexer 1102A is coupled to an input of an output amplifier 1106. The output amplifier 1106 is part of the buffer 1104. The output of the output amplifier 1106 is coupled to a pin 1108 via a pad 1110. The pad 1110 is also coupled to an input of an input amplifier 1112. The input amplifier 1112 is also part of the buffer 1104. The output of the input amplifier 1112 is coupled to an input of the multiplexer 1102B along with signals from other buffers. The output of the multiplexer 1102B is input to the module 1100A along with outputs from other multiplexers.

Outputs of the module 1100A, the module 1100B, other interfaces, and other circuits are also coupled to an input of the multiplexer 1102C. The output of the multiplexer 1102C is coupled to an output enable circuit 1114 of the buffer 1104. The output enable circuit 1114 as shown in FIG. 11 has an inverting input. In another embodiment, the output enable circuit 1114 has a non-inverting input. A signal on a select line (SEL) 1120A-D determines which input to the multiplexer 1102 is coupled to the multiplexer 1102 output. In an embodiment, the select line (SEL) 1120C may also be the select line (SEL) 1120A.

The output of the module 1100B is coupled to an input of the multiplexer 1102A. The output of the input amplifier 1112 is input to the multiplexer 1102D along with signals from other buffers. The output of the multiplexer 1102D is input to the module 1100B. An analog circuit 1116 is also coupled to the pad 1110. In this example, the input and output signals from modules 1100 may be mapped to the pad 1110.

A control circuit 1118 is coupled to the multiplexer select lines (SEL) 1120 via registers 1122A-D. The control circuit 1118 may be a processor that is configured by software depending on the type of application and peripherals the integrated circuit requires. The control circuit 1118 may provide default signals on the multiplexer select line 1120 to put the multiplexers 1102 in the most widely used configuration. In an alternative exemplary circuit, the control circuit 1118 is comprised of firmware. The control circuit 1118 may also be coupled to a power down 1124 on the buffer 1104 to control the power down 1124 function. In an alternative embodiment, the control circuit 1118 comprises a computer-readable medium carrying at least one instruction for execution by at least one processor to perform a method for controlling a multiplexer 1102.

The registers 1122 store data from the corresponding select line 1120. The registers 1122 alternatively are part of the control circuit 1118 and/or are part of the multiplexers 1102. The registers 1122 may also be combined so that a single register may service all of the select lines 1120. One combined register may be used in place of one register 1122 per multiplexer select line 1120.

All blocks shown in FIG. 11 may be deposited on a substrate 1126.

A multiplexer described herein may be combined with another multiplexer and need not be a stand-alone multiplexer. A pad described herein may be combined with another pad and need not be a stand-alone pad. A module described herein may be combined with another module and need not be a stand-alone module. A substrate described herein may be combined with another substrate and need not be a stand-alone substrate. A buffer circuit described herein may be combined with another buffer and need not be a stand-alone buffer. A select line (SEL) described herein may be combined with another select line.

Operation

A multiplexer is used to couple selected conductors between modules and pads. Referring to FIG. 1A, a signal on the select line 108 instructs the multiplexer 104 which module 100 and pad 102 are to be coupled together via the multiplexer 104. In one embodiment, only one of the modules 100 is coupled to the pad 102. In another embodiment, more than one of the modules 100 is coupled to the pad 102. Coupling of the pad 102 via the multiplexer 104 prevents an integrated circuit from becoming in/out limited and removes bottlenecks in signal transfer.

In other examples, mapping of a pad is limited so that not all of the modules may be coupled to all pads via a multiplexer. Every data line of every module need not be capable of being coupled to every pad. In some embodiments, it is desirable to have a group of input or output lines mapped to a specific set of pads. In other embodiments, it is desirable to have all data interface lines mapped to a specific set of pads.

In another example, modules may be coupled as necessary to provide flexibility of integrated circuit function. For example, if integrated into a headset, an integrated circuit may switch between functioning as an mp3 receiver and a monophonic telephone receiver as needed by the user's immediate requirements. As yet another example, a printer equipped with an integrated circuit may switch between interface modules as necessary without the need for multiple interface circuits located external to the integrated circuit.

Referring to FIG. 1B, signals on the select line 116 instruct the multiplexer 110 which of the pads 112 is to be coupled to the module 100A via the multiplexer 110. In one embodiment, only one of the pads 112 is coupled to the module 100A. In another embodiment, multiple pads 112 are coupled to the module 100A.

Referring to FIG. 2, a signal on the select line 208 instructs a multiplexer 204 which pad 202 and module 200 are to be coupled together via the multiplexer 204. In one embodiment, only one pad 202 is coupled to the module 200. In another embodiment, more than one of the pads 202 are coupled to the module 200.

Referring to FIG. 3, signals on the select lines 304 instruct at least one of the multiplexers 300 which of the modules 302 is to be coupled to the pad 202A. In one embodiment, only one of the modules 302 is coupled to the pad 202A. In another embodiment, more than one of the modules 302 are coupled to the pad 202A.

In FIG. 4, the output enable control 412 is actuated to control enablement of the amplifier 400 and/or the amplifier 406. The power down (PD) 410 is actuated to control power application to the buffer 414. The buffer 414 buffers the input and/or output signals to and/or from pad 402.

Referring to FIG. 5, a signal on the select line 508 instructs the multiplexer 504 if the clock circuit 500 and the pad 502 are to be coupled together via the multiplexer 504. Thus, a clock signal from the clock circuit 500 may also be coupled via the multiplexer 504 to the pad 502. This feature may be used to provide a clock signal from the clock circuit 500 for synchronization of the circuit on the substrate 506 with another circuit located off of the substrate 506. The clock signal may also be fed back from the clock circuit 500 to a second circuit on the substrate 506 via the multiplexer 504, the pad 502, and a second pad on the substrate 506. Provision of this clock signal via the multiplexer 504 may improve speed of testing the integrated circuit and circuits coupled to the integrated circuit.

Referring to FIG. 6, a clock signal from the clock circuit 600 may also be coupled via the multiplexers 610 to the pads 612. Signals on the select lines 614 instruct the multiplexers 610 if the clock circuit 600 and any of the pads 612 are to be coupled via the multiplexers 610. This feature may be used to provide a clock signal via the multiplexers 610 for synchronization of circuits that are coupled to the pads 612. Provision of this clock signal via the multiplexers 610 may improve speed of testing the integrated circuit and circuits coupled to the integrated circuit.

Referring to FIG. 7A, a clock signal from the clock circuit 702 may also be coupled via the multiplexer 704 to the module 700. A signal on the select line 708 instructs the multiplexer 704 if the clock circuit 702 and the module 700 are to be coupled via the multiplexer 704. This feature may be used to provide a clock signal for synchronization of the circuit on the substrate 706 with another circuit located on the substrate 706 via the multiplexer 704. Provision of this clock signal via the multiplexer 704 improves speed of testing the integrated circuit and circuits coupled to the integrated circuit.

Referring to FIG. 7B, a clock signal from the clock circuit 702 may also be coupled via the multiplexers 710 to the modules 712. Signals on the select lines 714 instruct the multiplexers 710 if the clock circuit 702 and any of the modules 712 are to be coupled via the multiplexers 710. This feature may be used to provide a clock signal for synchronization of the modules 712 via the multiplexers 710. Provision of the clock signal via the multiplexers 710 may also be used to speed testing both the integrated circuit and circuits coupled to the integrated circuit.

In an example that may be used with any of the figures described herein, a signal to and/or from an off-substrate clock circuit is coupled to and/or from a module via a pad, a buffer, and/or a multiplexer. An off-substrate clock circuit may supply a clock signal to an on-substrate module such as, and not limited to, a logic circuit and/or clock circuit.

Referring to the exemplary circuit shown in FIG. 8, an analog signal may be coupled between the analog circuit 800 and the pad 802 without being coupled via the multiplexer 806. Bypassing the multiplexer 806 in this manner minimizes analog signal distortion caused by digital noise feedback from the multiplexer 806. To further prevent distortion of the analog signal, power may be shut off to the buffer 808 by activating the power down control 810. Turning off power to the buffer 808 isolates the pad 802 from the multiplexer 806. In some examples, if the multiplexer 806 design is such that the multiplexer 806 does not distort the analog signal, then the analog circuit 800 may be coupled via the multiplexer 806 to the pad 802.

An embodiment may be used to salvage an integrated circuit containing a malfunctioning module. Referring to FIG. 11, if during testing of the integrated circuit, it is determined that the module 1100A is malfunctioning, then the control circuit 1118 issues a control signal on the multiplexer select lines 1120 to uncouple the malfunctioning module 1100A from the pad 1110 with the multiplexers 1102A-C. The control circuit 1118 then issues a control signal on the multiplexer select lines 1120 to couple a functioning module such as the module 1100B to the pad 1110 with the multiplexers 1102A,C,D. Although the integrated circuit cannot provide a function performed by the malfunctioning module 1100A, the integrated circuit may provide a function performed by the functioning module 1100B. Thus, the integrated circuit may be salvaged and need not be discarded. This reduces waste and increases fabrication facility efficiency.

An embodiment may also be used to provide for loopback of signals during testing of an integrated circuit. These tests may include for example, interface testing, clock testing, CPU testing, and module testing. An example of the method is as follows: Referring to FIGS. 1A and 2, the module 100A generates a test signal. The select line 108 instructs the multiplexer 104 to couple the module 100A to the pad 102, 202A. Assume for purposes of this example that the pad 102 is the pad 202A and the substrate 106 is the substrate 206. The multiplexer 104 couples the test signal from the module 100A to the pad 102, 202A. The select line 208 instructs the multiplexer 204 to couple the module 200 to the pad 102, 202A. The multiplexer 204 then couples the test signal from the pad 102, 202A to the module 200. Therefore, the test signal is looped back from the module 100A to the module 200. In one embodiment, the test signal is a clock signal and the module 100A is a clock circuit. In another embodiment, the multiplexer 104 and multiplexer 204 are part of the same multiplexer circuit.

An embodiment may be used to reduce production testing costs because an integrated circuit appears to a piece of test equipment as a simple device with a minimum number of pins. In an example, different interfaces may also be selected to determine if a processor or other circuits in the integrated circuit are functioning.

An integrated circuit that couples selected modules to selected pads may be used in a wide variety of products because the integrated circuit may connect to other circuits by many different interfaces. A single integrated circuit may be developed and sold to different market segments thus reducing development costs and time to market. The integrated circuit also may have a reduced number of pads, thus leading to a reduction in both chip size and manufacturing costs. Package types may also be reused from one design to the next. This circuit also has increased flexibility of use because it does not constrain a circuit board designer to a specific pin configuration. Pins may be placed at an optimal physical location in a package.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

What is claimed is:

1. An integrated circuit, comprising:
    a substrate;
    a pad deposited on the substrate;
    a first multiplexer deposited on the substrate and having a single multiplexed output coupled to the pad;
    a plurality of modules deposited on the substrate and coupled to the pad via the first multiplexer; and
    a second multiplexer deposited on the substrate and having a multiplexer input coupled to the pad.

2. The circuit of claim 1, further comprising a buffer deposited on the substrate and coupled between the first multiplexer and the pad.

3. The circuit of claim 2, wherein the buffer contains at least one of a buffer output enable and a power down circuit.

4. The circuit of claim 1, further comprising a clock circuit deposited on the substrate and coupled to the first multiplexer.

5. The circuit of claim 1, further comprising an analog circuit deposited on the substrate and coupled to the pad.

6. The circuit of claim 1, wherein the plurality of modules comprises at least one of a universal asynchronous receiver transmitter, a system packet interface, an inter-integrated circuit sound bus interface, an inter-integrated circuit bus interface, a universal serial bus interface, a parallel interface, a serial interface, digital to analog converter, analog to digital converter, and an audio interface.

7. The circuit of claim 1, further comprising a control circuit deposited on the substrate and coupled to the first multiplexer.

8. An integrated circuit, comprising:
    a substrate;
    a module deposited on the substrate;
    a plurality of pads deposited on the substrate; and
    a multiplexer deposited on the substrate and having a multiplexed output coupled to the module;
    wherein a plurality of multiplexer inputs is coupled to respective pads in the plurality of pads.

9. The circuit of claim 8, further comprising a buffer deposited on the substrate and coupled to and between the multiplexer and at least one of the pads.

10. The circuit of claim 9, wherein the buffer contains at least one of a buffer output enable and a power down circuit.

11. The circuit of claim 8, further comprising a clock circuit deposited on the substrate and coupled to the multiplexer.

12. The circuit of claim 8, further comprising an analog circuit deposited on the substrate and coupled to the pad.

13. The circuit of claim 8, wherein the module comprises at least one of a universal asynchronous receiver transmitter, a system packet interface, an inter-integrated circuit sound bus interface, an inter-integrated circuit bus interface, a universal serial bus interface, a parallel interface, a serial interface, digital to analog converter, analog to digital converter, and an audio interface.

14. The circuit of claim 8, further comprising a control circuit deposited on the substrate and coupled to the multiplexer.

15. The circuit of claim 1, further comprising a buffer coupled between the pad and the multiplexer input.

* * * * *